United States Patent [19]
Pfleiderer et al.

[11] Patent Number: 4,760,035
[45] Date of Patent: Jul. 26, 1988

[54] INTEGRATED CIRCUIT IN COMPLEMENTARY CIRCUIT TECHNOLOGY

[75] Inventors: Hans-Joerg Pfleiderer; Alfred Schuetz, both of Zorneding, Fed. Rep. of Germany

[73] Assignee: Siemens Aktiengesellschaft, Berlin and Munich, Fed. Rep. of Germany

[21] Appl. No.: 942,023

[22] Filed: Dec. 12, 1986

Related U.S. Application Data

[62] Division of Ser. No. 749,589, Jun. 27, 1985, abandoned.

[30] Foreign Application Priority Data

Jun. 29, 1984 [DE] Fed. Rep. of Germany ....... 3424094

[51] Int. Cl.$^4$ .......................................... H01L 21/425
[52] U.S. Cl. ........................................ 437/57; 437/41; 357/42
[58] Field of Search ............. 357/42, 15, 15 M, 15 R; 29/571, 576 B, 576 W, 577 C; 437/57, 41

[56] References Cited

U.S. PATENT DOCUMENTS

| 4,167,747 | 9/1979 | Satou et al. | 357/42 X |
| 4,300,152 | 1/1981 | Lepselter | 357/15 X |
| 4,435,896 | 3/1984 | Parrillo et al. | 29/571 |
| 4,477,310 | 10/1984 | Park et al. | 29/571 |
| 4,480,196 | 10/1986 | Hinz et al. | 357/15 X |
| 4,513,309 | 4/1985 | Cricchi | 357/42 |

OTHER PUBLICATIONS

Yang, "Fundamentals of Semiconductor Devices" McGraw-Hill Book Co., N.Y., 1978, pp. 138–139.

Primary Examiner—George T. Ozaki
Attorney, Agent, or Firm—Hill, Van Santen, Steadman & Simpson

[57] ABSTRACT

An integrated circuit in complementary circuit technology comprising two field effect transistors (T1, T2) of different channel types with the first one (T2) mounted in a doped semiconductor body (1) having a first conductivity type and the other FET (T1) mounted in a semiconductor zone 2 of a second conductivity type which is arranged in said body. The object is to provide a protection against thermal overloads which can appear due to "latch up" influences when overvoltages at the one connecting region of the field effect transistor (T1) mounted in the semiconductor zone occur. This is accomplished by the mounting of a metal contact (12) on the surface of a semiconductor region (2') inserted into the semiconductor body 1 and doped oppositely thereto with such metal contact forming a Schottky diode (D) with the semiconductor region (2') which can be connected to the connecting region of the field effect transistor T1 mounted in the semiconductor region 2 whereas the semiconductor region (2') is electrically connected to the supply voltage ($V_{DD}$). The circuits are applied in CMOS circuits.

1 Claim, 3 Drawing Sheets

INTEGRATED CIRCUIT IN COMPLEMENTARY CIRCUIT TECHNOLOGY

This is a division, of application Ser. No. 749,589, filed June 27, 1985, now abandoned.

BACKGROUND OF THE INVENTION

1. Field of the Invention

This invention relates in general to integrated circuits and in particular to integrated circuits in complementary circuit technology comprising at least two MIS field effect transistors of different channel types wherein the first is mounted in a doped semiconductor body of a first conductivity type and the second is mounted in a tub-shaped semiconductor body of a second conductivity type mounted in the semiconductor body.

2. Description of the Prior Art

In integrated circuits of the complementary circuit technology wherein two field effect transistors of different channel types with the first one mounted in a doped semiconductor body of a first conductivity type and the second mounted in a tub-shaped semiconductor body of a second conductivity type and wherein the semiconductor body 2 of the second conductivity type is electrically connected to a supply voltage and the first field effect transistor is provided with a source terminal which lies at a reference potential there is a difficulty in that four successive semiconductor layers of alternating conductivity type are generally present between a terminal of a field effect transistor of the first channel type which is mounted in the tub-shaped semiconductor region and a terminal of a field effect transistor of the second channel type which is mounted outside of this zone such that the one connecting region of the first transistor forms the first semiconductor layer and the tub-shaped semiconductor region forms the second with the semiconductor body forming the third and the one connecting region of the second transistor forming the first semiconductor layer. When an overvoltage which exceeds the supply voltage by a specific amount, as for example 500 mV, occurs on the mentioned terminal of the transistor of the first channel type, the pn-junction between the first and second semiconductor layers can be positively biased to a degree such that a current path occcurs between the transistor terminals and this current path is attributable to a parasitic thyristor effect (latchup) within the four layer structure. This current path will also remain in effect after the decay of the overvoltage and can thermally overload the integrated circuit.

SUMMARY OF THE INVENTION

It is an object of the present invention to eliminate the disadvantages of the prior art described above. A feature of the invention is to provide a metal contact at the surface of a semiconductor region inserted into the semiconductor body and doped oppositely thereto with the metal contact forming a Schottky diode together with the semiconductor region and the metal contact is connected to a connecting region of the second field effect transistor whereas the semiconductor region is electrically connected to the supply voltage $V_{DD}$.

The advantages obtainable with the invention lie particularly in that the parasitic thyristor effect is avoided by means of a simple structure which particularly during manufacture of the circuit does not require any additional method steps but only slight modifications of the prior art steps:

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
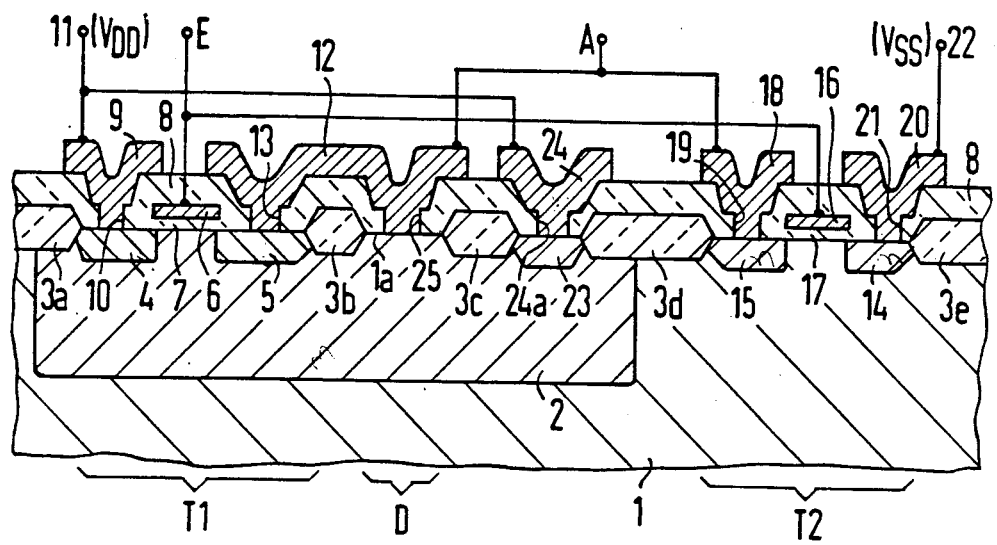
FIG. 1 is an exemplary embodiment of the invention.

As illustrated in FIG. 1 an integrated circuit comprises a body 1 of doped semiconductor material, as for example, p-conductivity type silicon. The semiconductor body 1 contains a n-conductive tub-shaped conductor region 2 which extends up to the boundary layer 1a of the body 1. Mounted at the boundary surface 1a are field insulated regions 3a, 3b, 3c, 3d, and 3e which may be made of, for example, $SiO_2$ and between these insulation regions 3a through 3e, respective gate insulation regions which cover the active regions of the semiconductor circuit are mounted. There is provided in a first active region which is mounted in the lateral boundaries of the semiconductor region 2 a small p+ doped region 4 and a p+ doped region 5 which respectively form the source and drain regions of p— channel type field effect transistor T1. The channel region lying between regions 4 and 5 is covered by gate 6 which is provided with a terminal E and is separated from the boundary surface 1a by a thin gate insulation layer 7 of, for example, $SiO_2$. A conductive coating 9 is applied to an intermediate insulation layer 8 which covers the gate 6 and it contacts the source region 4 through a window 10 formed in insulation layer 8 and is provided with a terminal 11. The terminal 11 is therefore is electrically connected to a supply voltage $V_{DD}$. Another conductive coating 12 is connected to the intermediate insulation layer 8 and contacts the drain region 5 in the area of a window 13 and is electrically connected to a terminal A.

An n-channel field effect transistor T2 is mounted in an active region lying between the insulation regions 3d and 3e and field effect transistor T2 is formed with n+ doped regions 14 and 15 which are formed in the body 1 as shown. A gate region 16 lies between the regions 14 and 15 and is separated by gate insulation layer 17. The gate 16 is connected to terminal E. A conductive coating 18 which contacts the drain region 15 through a window 19 of the intermediate insulating layer 8 is connected to terminal A and a conductive coating 20 which contacts the source region 14 through a window 21 is connected to a terminal 22 to which is applied a reference potential $V_{SS}$.

An n+ doped connecting region 23 is inserted into the semiconductor region 2 and this region 23 is contacted in the region of a window 24a by a conductive coating 24 mounted above the intermediate insulation layer 8 and the conductive coating 24 is connected to terminal 11.

In the region of an additional window 25 of the intermediate insulation layer 8 a part of the conductive coating 12 forms a metal contact on the surface of the n-conductive semiconductor region 2 and this metal contact comprises a Schottky diode together with semiconductor region 2. Assuming an n-doping concentration about $10^{16} \text{cm}^{-3}$ in the semiconductor region 2, the conductive coating 12 is expediently composed of aluminum. It is also advantageous if the conductive coating 12 is composed of tantalum silicide ($TaSi_2$) or it can be designed as a double layer which comprises a first layer of $TaSi_2$ and a second layer of aluminum which overlies the first layer. Other materials which are employed in a known fashion for Schottky diodes such as, for example, platinum or molybdenum may also be used for the conductive coating 12. Aluminum or the double layer of $TaSi_2$ and Al, however, have the advantage that they can also be employed for the coatings 9, 18, 20 and 24 such that all of the coatings on the intermediate insulation layer 8 can be applied in a single process step. It is essential that the leading threshold voltage $V_D$ of the Schottky diode D be lower than the leading threshold voltage of the pn-junction between the semiconductor region 5 and the semiconductor region 2 and this is referenced as $V_{pn}$.

Figure 2:
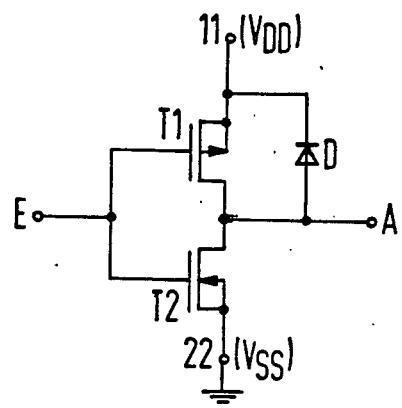
FIG. 2 is a circuit diagram of the exemplary embodiment of FIG. 1.

As is illustrated in FIG. 2 the p-channel transistor T1 and n-channel transistor T2 are series connected with their source and drains connected to the supply voltage $V_{DD}$ which is supplied via 11 and 22 and their gates are electrically connected to the common terminal E. The Schottky diode D which is composed of parts 12 and 2 is inserted between terminals A and 11. In case a voltage which exceeds the supply voltage $V_{DD}$ by amount that is equal to or greater than the leading threshold voltage $V_D$ of the Schottky diode D appears at the inverter output A during operation, then D becomes conductive and limits the voltage $V_A$ to the value $V_A = V_{DD} + V_D$. Thus, it is avoided that $V_A$ continues to increase and reaches or exceeds a value $V_A = V_{DD} + V_{pn}$ which causes parasitic thyristor effects to occur in the region of the four layer structures 5, 2, 1 and 14 with such thyristor effects potentially leading to the formation of a current path between terminals A and 22 and to a thermal overload of the entire structure.

Figure 3:
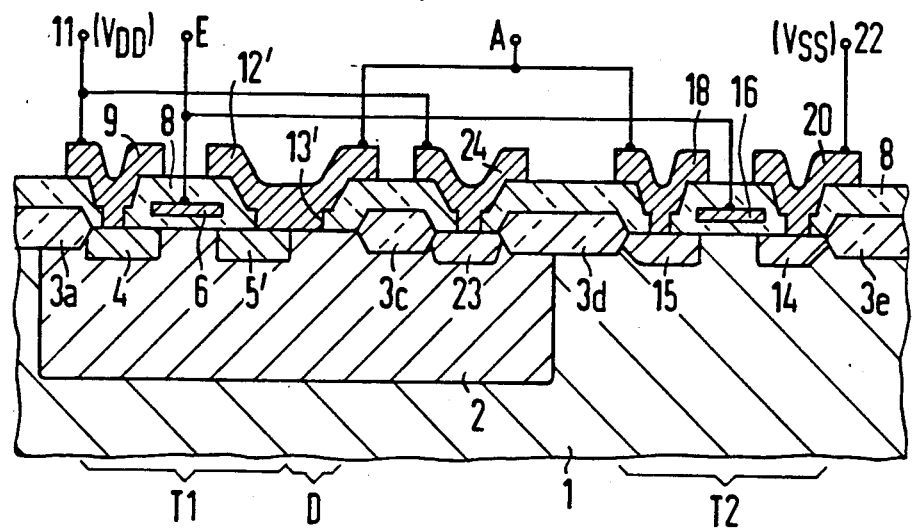
FIG. 3 is a modified form of the invention.
Figure 4:
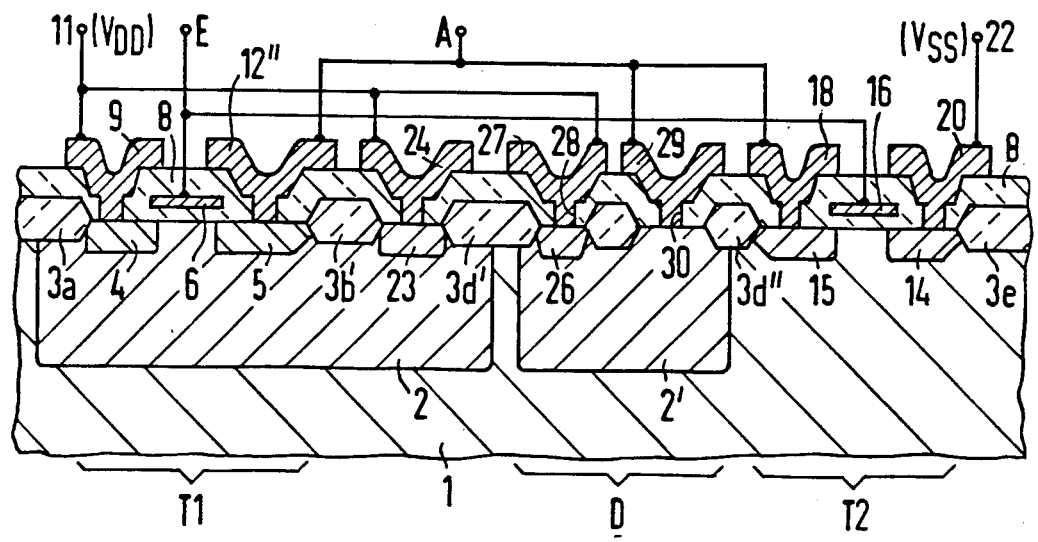
FIG. 4 is another embodiment of the invention.

FIG. 3 illustrates a modification of the exemplary embodiment of FIG. 1 and differs from FIG. 1 in that the windows 13 and 25 are combined to a single window 13' and the conductive coating 12 which is designated by 12' in FIG. 3 contacts both the drain region 5' of T1 as well as the semiconductor region 2 in the area of this window. Since the drain region 5' is significantly higher doped than the semiconductor region 2, the coating 12' forms an ohmic contact on 5' and forms the Schottky diode D with the semiconductor zone 2. Another embodiment of the invention is illustrated in FIG. 4 wherein the Schottky diode D is arranged differently than in FIG. 1 and it lies in its own n-conductive semiconductor region 2' which is inserted into the semiconductor body next to the n-conductive semiconductor region 2. The region 2' has approximately the same doping concentration as region 2. The field insulation region 3b and 3c of FIG. 1 are combined into a single field insulation region 3b' and the coating 12" which replaces the coating 12 of FIG. 1 contacts only the drain region 5 of transistor T1. The field insulation regions 3d is divided into two regions 3d' and 3d" and the semiconductor region 2' is mounted therebetween. An n+ doped connecting region 26 is inserted into the semiconductor region 2' and this is contacted by conductive coating 27 in the area of a window 28 of the intermediate insulation layer 8. The coating 27 is connected to terminal 11. A conductive coating 29 which is composed of the same material as the coating 12 illustrated in FIG. 1 forms a metal contact in the area of a window 30 of the intermediate insulation layer 8 on the semiconductor region 2' and this metal contact comprises the Schottky diode D together with semiconductor region 2'. The coating 29 is connected to terminal A.

In FIGS. 3 and 4, those parts which were described with reference to FIG. 1 are provided with the same reference characters as in FIG. 1. The modifications of FIGS. 3 and 4 operate in the same manner as that described for FIG. 1 and the electrical schematic of FIG. 2.

In order to manufacture the circuit according to FIG. 1 an n-doped tub-shaped semiconductor region 2 which, for example, has a doping concentration of $10^{16} \text{cm}^{-3}$ is inserted by means of a diffusion process into a body 1 of p-conductive silicon which has a basic doping concentration of about $10^{15} \text{cm}^{-3}$. Subsequently, a thin $Si_3N_4$ layer is applied to the boundary surface 1a and such $Si_3N_4$ layer being structured such by means of a photolithographic step that it remains only on the active semiconductive regions. Field oxidation regions 3a through 3e of $SiO^2$ are formed by means of thermal oxidation at those locations on the body 1 that are not covered by the $Si_3N^4$ layer. After removal of the $Si_3N_4$ layer portions, gate oxide layers S1 through S4 are grown on the active regions of the semiconductor body 1 by thermal oxidation process and these gate oxide layers form the previously mentioned gate oxide regions. The gates 6 and 16 of the field effect transistor T1 and T2 are then formed on the gate oxide layers S1 and S4 by using photolithographic steps and are formed therefrom with a polycrystalline silicon layer that has been applied on the surface.

Figure 5:
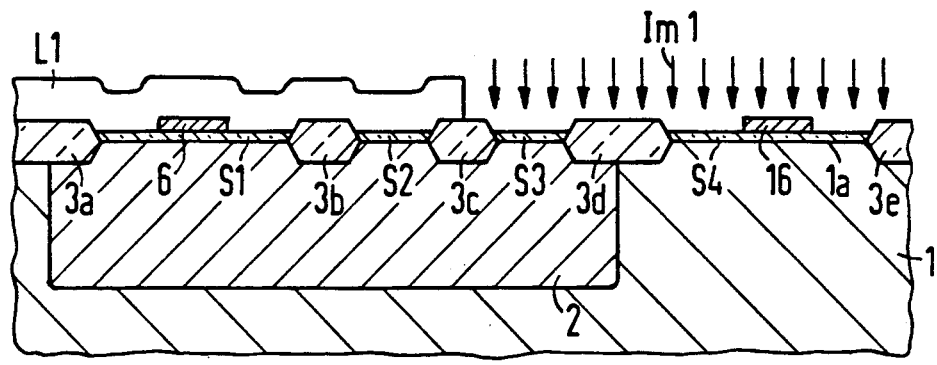
FIGS. 5, 6 and 7 illustrate various steps in the method of manufacturing the embodiment of FIG. 1.

As is illustrated in FIG. 5 the n+ doped regions 14 and 15 of transistor T2 and the connecting region 23 are generated by means of ion implantation which is indicated by the arrows Im1. The lefthand part of the semiconductor body 1 extending up to the middle of the thick film region 3c is covered with a photoresist layer L1 during this time.

Figure 6:
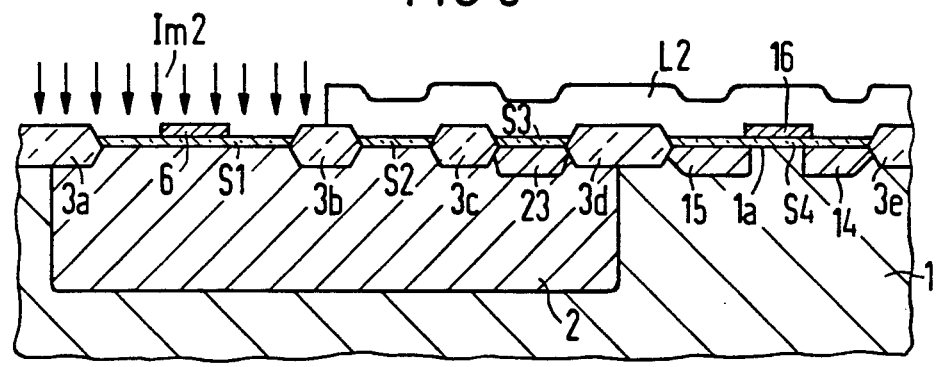

Then the photoresist layer L1 is removed and as shown in FIG. 6, a further photoresist layer L2 is applied which covers the righthand portion of the body 1 up to the middle of the thick film region 3b whereby p+doped region 4 and 5 of transistor T1 are formed by means of ion implantation which is indicated by arrows Im2.

Figure 7:
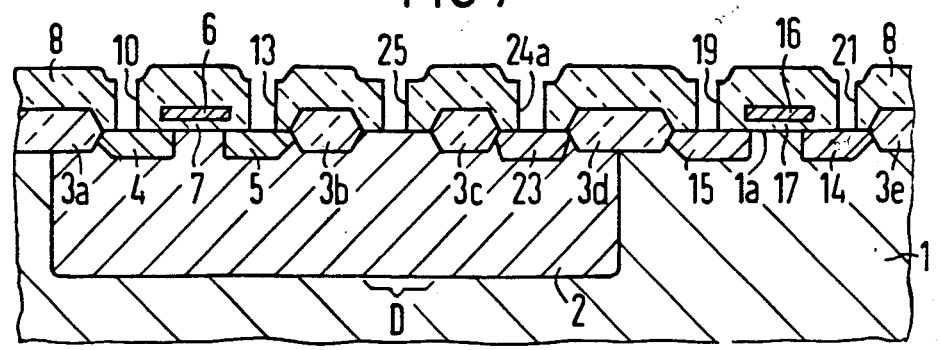

As is illustrated in FIG. 7, an intermediate insulation layer of $SiO_2$ is applied using a deposition technique in a following method step and this layer 8 is provided with windows 10, 13, 21, 19, 24a and 25 above the regions 4, 5, 14 and 15 as well as above the connecting region 23 and between the field insulation regions 3b and 3c. These windows are etched through to the boundary layer 1a so that the gate insulation layers S1 through S4 indicated in FIG. 6 are also opened. For reasons of a simplified illustration the gate insulation layers S1 and S4 are not separately illustrated but are provided with the reference characters 7 and 17 since they lie under the gates 6 and 16. The remaining parts of S1 and S4 as well as the layers S2 and S3 are incorporated into the intermediate insulation layer 8 and are shown together with the insulation layer 8 as a uniform insulation layer.

The conductive coatings 9, 12, 24, 18 and 20 are subsequently applied with this preferably occurring by means of a corresponding structuring of a surface wide coating by means of photolithographic steps. The coatings 9 and 24 finally are provided with the terminal 11 and the coating 20 is provided with the terminal 22 and the gates 6 and 16 are provided with the terminal E. The coatings 12 and 18 are provided with a terminal A.

Other embodiments of the invention differ from those described in that the individual semiconductor parts are replaced by those of the respectively opposite conductivity types whereby the voltage of the opposite polarity can then be applied.

In addition to these embodiments, the inventive concept also encompasses other integrated circuits in complementary circuit technology wherein at least two field effect transistors having different channel types are integrated in a semiconductor body such that at least one of them belongs to a first channel type and lies in a tub-shaped zone which is of a conductivity type opposite to that of the semiconductor body and where as least one other field effect transistor has a second channel type and is mounted in the semiconductor body outside of this zone. The tub-shaped zone is thereby always electrically connected to a supply voltage. The parasitic thyristor effect which was described under the Prior Art with reference to the transistors T1 and T2 which can occur in any circuit of this type is suppressed by the insertion of a Schottky diode between a connecting region of the field effect transistor lying in the tub-shaped zone and the terminal of the supply voltage when the leading threshold voltage $V_D$ of the Schottky diode is selected to be lower than the leading threshold voltage of the pn-junction between this connecting region in the tub-shaped zone.

Although the invention has been described with respect to preferred embodiments, it is not to be so limited as changes and modifications can be made which are within the full intended scope of the invention as defined by the appended claims.

We claim as our invention:

1. A method for the manufacture of an integrated circuit comprising the steps of forming on a body (1) of doped semiconductor material of a first conductivity type which is covered on a boundary surface (1a) by field insulation regions (3a through 3e) and gate insulation regions (S1 through S4) a tub-shaped zone (2) of a second conductivity type which extends up to the boundary surface (1a), applying a polycrystalline silicon layer to the insulation layer formed by photolithographic processes so that gates (6, 16) of field effect transistors are formed on at least one gate insulation region (S1) above the tub-shaped zone (2) and on a further gate insulation region (S4) outside of said zone (2), forming source and drain regions (14, 15) of the field effect transistors which lie outside of the zone (2) and the connecting region (23) of the zone (2) by an ion implantation (Im1) with the part of the insulation layer lying above the tub-shaped zone (2) except for a sub-region above a connecting region (23) of this zone covered by an implantation mask (L1) such as a photoresist layer, forming the source and drain regions (4, 5) of the field effect transistors lying within the zone by a further ion implantation (Im2) wherein the part of the insulation layer lying outside the tub-shaped zone (2) is covered by a further implantation mask (L2) of a further photoresist layer, and one of the gate insulation regions (S2) which is mounted above the tub-shaped zone is covered by the implantation masks of both ion implantations, and applying an intermediate insulation layer (8) and forming it with windows extending to the boundary layer (1a) of the body (1), above the source and drain regions of the field effect transistors, above the connecting region (23) of the zone and above the gate insulation region (S2) which are covered by both implantation masks, and applying conductive coatings (9, 12, 24, 18 and 20) to the intermediate insulation layer (8) which respectively contact the parts of the body (1) in the regions of the windows which lie therebelow, and applying terminals to these conductive coatings so as to apply supply voltage and the reference voltage.

* * * * *